US012757509B2

(12) United States Patent
Quaade et al.

(10) Patent No.: US 12,757,509 B2
(45) Date of Patent: Oct. 6, 2026

(54) IMAGE CAPTURE APPARATUS AND METHODS USING COLOR CO-SITE SAMPLING

(71) Applicant: NIL Technology ApS, Kongens Lyngby (DK)

(72) Inventors: Ulrich Quaade, Bagsvaerd (DK); James Eilertsen, Skodsborg (DK)

(73) Assignee: NIL Technology ApS, Kongens Lyngby (DK)

( * ) Notice: Subject to any disclaimer, the term of this patent is extended or adjusted under 35 U.S.C. 154(b) by 49 days.

(21) Appl. No.: 18/289,169

(22) PCT Filed: May 16, 2022

(86) PCT No.: PCT/EP2022/063204
§ 371 (c)(1),
(2) Date: Nov. 1, 2023

(87) PCT Pub. No.: WO2022/243252
PCT Pub. Date: Nov. 24, 2022

(65) Prior Publication Data

US 2024/0222404 A1 Jul. 4, 2024

Related U.S. Application Data

(60) Provisional application No. 63/190,271, filed on May 19, 2021.

(51) Int. Cl.
*H10F 39/00* (2025.01)
*G02B 1/00* (2006.01)
(Continued)

(52) U.S. Cl.
CPC ........... *H10F 39/806* (2025.01); *G02B 1/002* (2013.01); *H04N 23/12* (2023.01); *H04N 23/84* (2023.01)

(58) Field of Classification Search
CPC ............... H10F 39/806; H10F 39/8033; H10F 39/8067; G02B 1/002; H04N 23/12; H04N 23/84
See application file for complete search history.

(56) References Cited

U.S. PATENT DOCUMENTS 10,418,410 B2 9/2019 Buettgen
2010/0178722 A1* 7/2010 de Graff ............... H10F 39/026 438/73

(Continued)

FOREIGN PATENT DOCUMENTS

EP 3029731 6/2016
WO WO 2012/012900 2/2012

(Continued)

OTHER PUBLICATIONS

International Preliminary Report on Patentability in International Appln. No. PCT/EP2022/063204, mailed on Nov. 30, 2023, 7 pages.

(Continued)

*Primary Examiner* — Lin Ye
*Assistant Examiner* — Tuan H Le
(74) *Attorney, Agent, or Firm* — Fish & Richardson P.C.

(57) ABSTRACT

An apparatus includes a sensor having one or more drift-field demodulation pixels and wavelength separating optical elements (WSOEs) such as metalenses and diffractive optical elements (DOEs). The WSOE can be configured such that when light is incident on a pixel, the light passes through the WSOE first and such that different wavelengths are focused by the WSOE on different spatial points in the associated pixel.

20 Claims, 9 Drawing Sheets

(51) Int. Cl.

| | |
|---|---|
| ***H04N 23/12*** | (2023.01) |
| ***H04N 23/84*** | (2023.01) |

(56) References Cited

U.S. PATENT DOCUMENTS

| | | | | |
|---|---|---|---|---|
| 2013/0009263 | A1 | 1/2013 | Hatano et al. | |
| 2013/0026548 | A1 | 1/2013 | McCarten | |
| 2014/0263982 | A1 | 9/2014 | Shkunov et al. | |
| 2016/0133762 | A1 | 5/2016 | Blasco Claret | |
| 2018/0301498 | A1* | 10/2018 | Buettgen | H10F 39/1865 |
| 2020/0027909 | A1 | 1/2020 | Ebiko et al. | |
| 2021/0118938 | A1 | 4/2021 | Roberts et al. | |
| 2021/0288095 | A1 | 9/2021 | Delga et al. | |
| 2021/0307608 | A1* | 10/2021 | Hu | A61B 3/14 |
| 2022/0086319 | A1* | 3/2022 | Yen | G02B 5/20 |

FOREIGN PATENT DOCUMENTS

| | | |
|---|---|---|
| WO | WO 2013/104718 | 7/2013 |
| WO | WO 2017/058109 | 4/2017 |
| WO | WO 2017/061951 | 4/2017 |
| WO | WO 2020/236575 | 11/2020 |

OTHER PUBLICATIONS

International Search Report and Written Opinion in International Appln. No. PCT/EP2022/063204, mailed on Sep. 12, 2022, 12 pages.

* cited by examiner

IMAGE CAPTURE APPARATUS AND METHODS USING COLOR CO-SITE SAMPLING

CROSS-REFERENCE TO RELATED APPLICATIONS

This application is a National Stage application under 35 U.S.C. § 371 of International Application No. PCT/EP2022/063204, filed on May 16, 2022, which claims the benefit of priority from U.S. Provisional Patent Application No. 63/190,271, filed on May 19, 2021, the contents and disclosures of which are incorporated herein by reference in their entirety.

FIELD OF THE DISCLOSURE

The present disclosure relates to image capture apparatus and image capture techniques using color co-site sampling.

BACKGROUND

An image capture system can focus a scene on an image plane. In some cases, a single sensor is used to sense, for example, red, green and blue colors. To obtain the three colors, a color filter array (CFA) such as an RGB Bayer pattern can be placed in front of the sensor, so that each sensor cell senses a different color. After sensing the colors, a color reconstruction algorithm may be applied to obtain the colors where they were not sensed. Various color reconstruction algorithms are available and may be based, for example, on interpolation. After the color reconstruction, further image processing may be performed to obtain the image in YUV format, which is the input of the compression system.

Reconstruction techniques, however, are not always ideal. Color co-site sampling is one alternative that can be used. In some applications, co-site sampling involves moving the sensor so that the same image can be captured by multiple (e.g., four) different pixels. The signals from multiple pixels then can be combined to reconstruct the image using, for example, color interpolation and/or debayering techniques.

SUMMARY

The present disclosure describes an apparatus (e.g., an optoelectronic module) that includes a sensor having one or more drift-field demodulation pixels and wavelength separating optical elements (WSOEs) (e.g., diffractive optical elements (DOEs), metalenses, high dispersion lenses, high dispersion layers). The WSOE can be configured such that when light is incident on a pixel, the light passes through the WSOE before reaching the associated pixel and such that different wavelengths are focused on different spatial points (e.g., different depths) in the associated pixel. By focusing different wavelengths onto different depths within the pixel, each wavelength (or wavelength range) can, in some cases, be more concentrated at a given depth within the pixel. More generally, the ability to focus different wavelengths onto different depths within the pixel can, in some cases, help enhance the ability to detect and readout various wavelengths.

For example, in accordance with one aspect, the present disclosure describes an apparatus that includes a sensor and a WSOE. The sensor includes a drift-field demodulation pixel. The WSOE is disposed such that, when radiation is incident on the drift-field demodulation pixel, the radiation passes through the WSOE before reaching the drift-field demodulation pixel. The WSOE is configured to focus different wavelengths of the incident radiation at different respective depths in a photo-sensitive detection region of the drift-field demodulation pixel.

Some implementations include one or more of the following features. For example, in some instances, the drift-field demodulation pixel has different potential profiles distributed over the different respective depths. The drift-field demodulation pixel can be operable such that photo-generated charges generated at the different respective depths have different respective drift velocities. Read-out circuitry can be coupled to an output of the drift-field demodulation pixel and can be operable to sample the photo-generated charges at different times based on the different respective drift velocities.

In some implementations, the WSOE is attached to the drift-field demodulation pixel. For example, in some instances, the WSOE is attached to a backside of the drift-field demodulation pixel. In other implementations, the WSOE is disposed over a front-side of the drift-field demodulation pixel. In some cases, the WSOE is separated at a distance from the front-side of the drift-field demodulation pixel. Further, in some implementations, a multi-band pass filter is disposed between the WSOE and the drift-field demodulation pixel.

The present disclosure also describes a method that includes receiving radiation in a photo-sensitive detection region of a drift-field demodulation pixel. The radiation passes through a WSOE before reaching the drift-field demodulation pixel, and the WSOE focuses different wavelengths of the radiation at different respective depths in the drift-field demodulation pixel.

Some implementations include one or more of the following features. For example, in some instances, the drift-field demodulation pixel generates photo-generated charges in response to receiving the different wavelengths of the radiation at different respective depths, and the method further includes sampling, at different time, signals associated with the photo-generated charges at the different depths. The method also can include determining spectral data based on the sampled signals. In some instances, the method includes combining images based on the sampled signals to obtain a multi-color image for the drift-field demodulation pixel.

Some implementations can provide for micro scanning-free color co-site sampling. For example, in accordance with some implementations, a pixel in an optoelectronic sensor can capture the same image over multiple wavelengths, such that benefits of color co-site sampling can be realized without physically scanning (i.e., without moving the sensor).

Other aspects, features and advantages will be readily apparent from the following detailed description, the accompanying drawings and the claims.

DETAILED DESCRIPTION

The present disclosure describes optoelectronic modules that include a sensor having one or more drift-field demodulation pixels and wavelength separating optical elements (WSOEs) such as diffractive optical elements (DOEs), metalenses, high dispersion lenses, and high dispersion layers. Each metalens can be configured such that when light having multiple wavelengths is incident on a pixel, the light passes through the metalens first, such that different wavelengths are focused on different spatial points (e.g., different depths) in the associated pixel. A metalens, for example, can include a metasurface, which refers to a surface with distributed small structures (e.g., meta-atoms or other nanostructures) arranged to interact with light in a particular manner. In the case of a metalens, the meta-atoms are arranged so that the metastructure functions as a lens.

The disclosed modules and techniques can, in some instances, result in higher concentrations of respective wavelengths at particular points in the pixel, which can help enhance the ability to detect and readout signals corresponding to the various wavelengths (e.g., red, green, blue).

Figure 1:
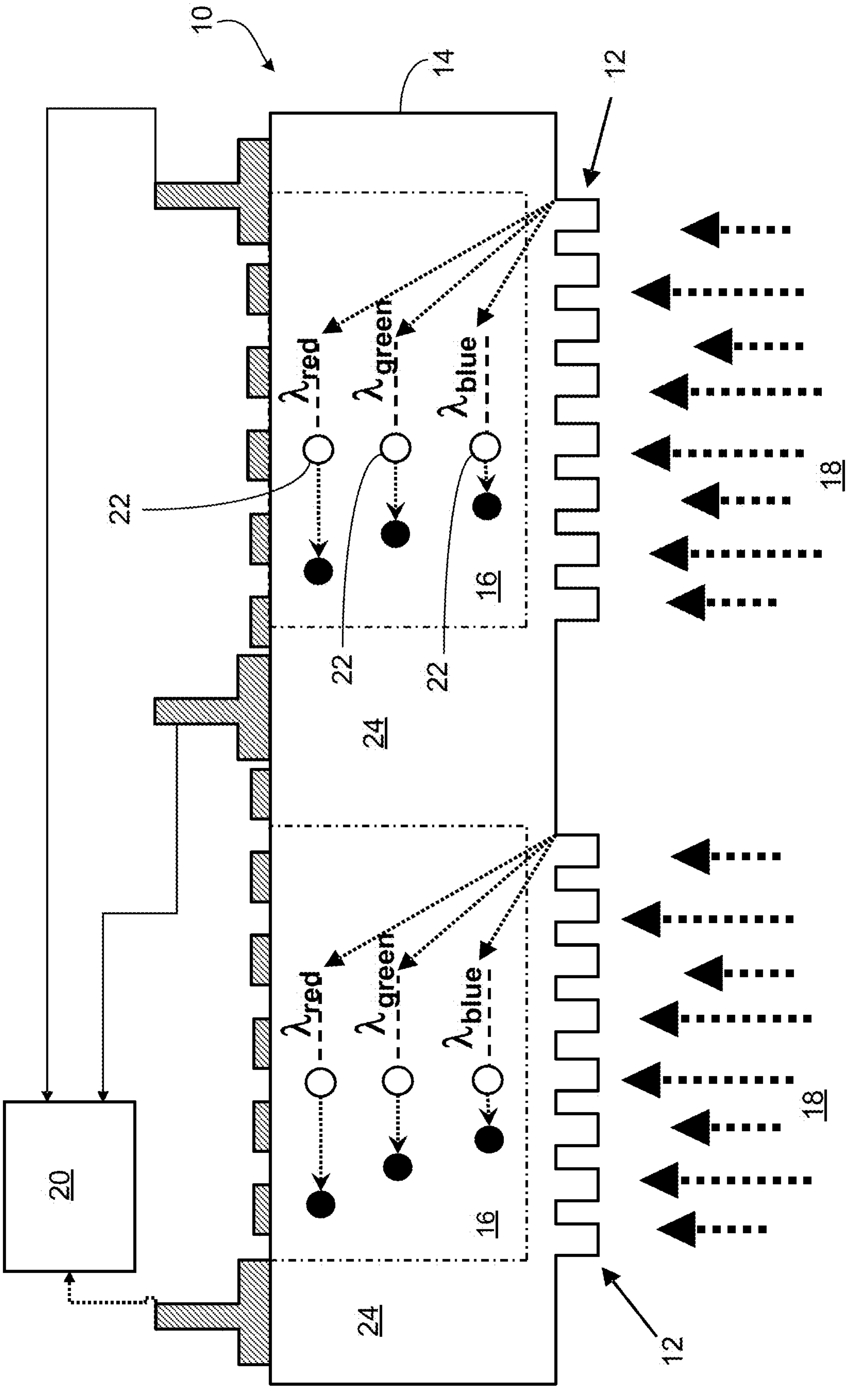
FIG. 1 illustrates a first example of an optoelectronic module that includes a metalens as the WSOE.

As shown in the example of FIG. 1, an optoelectronic module 10 includes WSOEs, such as a metalenses 12, integrated or otherwise attached to the backside of a substrate 14 in which is formed an array of drift-field demodulation pixels 16. The metalenses 12 (or other WSOE) are configured such that when light 18 having multiple wavelengths is incident on the metalenses 12, different wavelengths are focused on different spatial points in the respective pixels 16. For example, by focusing different wavelengths onto different depths within the pixel, each wavelength (or wavelength range) can be more concentrated at a given depth within the pixel. For example, if the incident light 18 includes wavelengths in the red, green and blue parts of the electromagnetic spectrum, each metalens 12 focuses the different wavelengths onto different respective regions (e.g., at different respective depths) in the associated pixel 16. More generally, however, the incident light 18 can be any composition of wavelengths (e.g., from infrared to visible to ultraviolet).

Figure 2:
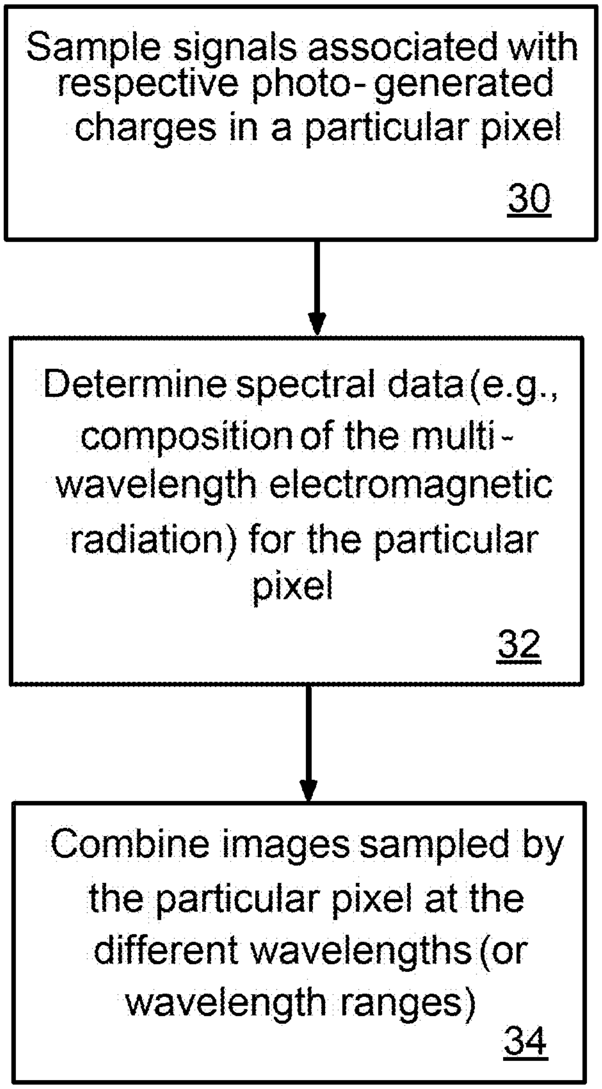
FIG. 2 is a flow chart showing various operations of read-out and signal processing circuitry.

Different portions of the multi-wavelength electromagnetic radiation 16 can penetrate the substrate 14 to different depths. In each demodulation pixel 16, different potential profiles are distributed over a range of depths, and photo-generated charges 22 generated at different depths can be associated with different portions of the multi-wavelength electromagnetic radiation. The photo-generated charges 22 generated at different depths can have respective (e.g., different) drift velocities. If the photo-generated charges generated at different depths have different respective drift velocities, the photo-generated charges will arrive at the pixel's charge-collection region 24 at different points in time. Accordingly, signals associated with the respective photo-generated charges in a particular pixel can be sampled by read-out circuitry and signal processing 20 at different times (see block 30 of FIG. 2) and can be associated with the different portions of the multi-wavelength electromagnetic radiation (i.e. light 18) incident on the photo-sensitive detection region.

The read-out and signal processing circuitry 20, which may include, for example, a signal processor, can determine spectral data such as the composition of the multi-wavelength electromagnetic radiation (e.g., the wavelengths and/or wavelength ranges and their respective intensities for the particular pixel). See block 32 of FIG. 2. The circuitry 20 then can combine the images sampled by the particular pixel at the different wavelengths (or wavelength ranges) to obtain a multi-color image for the particular pixel (see block 34 of FIG. 2). The foregoing operations can be performed for each pixel in the sensor, and the circuitry 20 can generate a multi-color image based on all the pixels. Thus, the module 10 can, in some implementations, be operable such that micro color co-site sampling can be achieved without the need to move the sensor and without the need for color reconstruction.

In some instances, the metalens 12 or other WSOE can be configured such that a single wavelength or narrow band of wavelengths is focused onto a particular region of the pixel 16, and to disperse other wavelengths throughout the depth of the substrate 14. Such a feature can be advantageous to allow the read-out circuitry and signal processing 20 to sample and process the single wavelength or narrow band of wavelengths differently than other wavelengths. For example, in some instances, the single wavelength or narrow band of wavelengths may be discarded.

Further details of an example of the drift-field demodulation pixel 16 are described below in connection with FIG. 5. However, other implementations of drift-field demodulation pixels can be used as well.

Although FIG. 1 shows the multi-wavelength light 18 incident through the backside of the pixel(s) 16, in some implementations it may incident through the front-side of the pixel. In such implementations, the metalens 12 or other WSOE can be disposed over the front-side of the sensor, that is, over the front-side of the pixel(s) 16. Further, as shown in the example module 10A of FIG. 3, the metalens 12 or other WSOE structure need not be attached directly to the pixel(s) 16, but may be separated from them.

Figure 4:
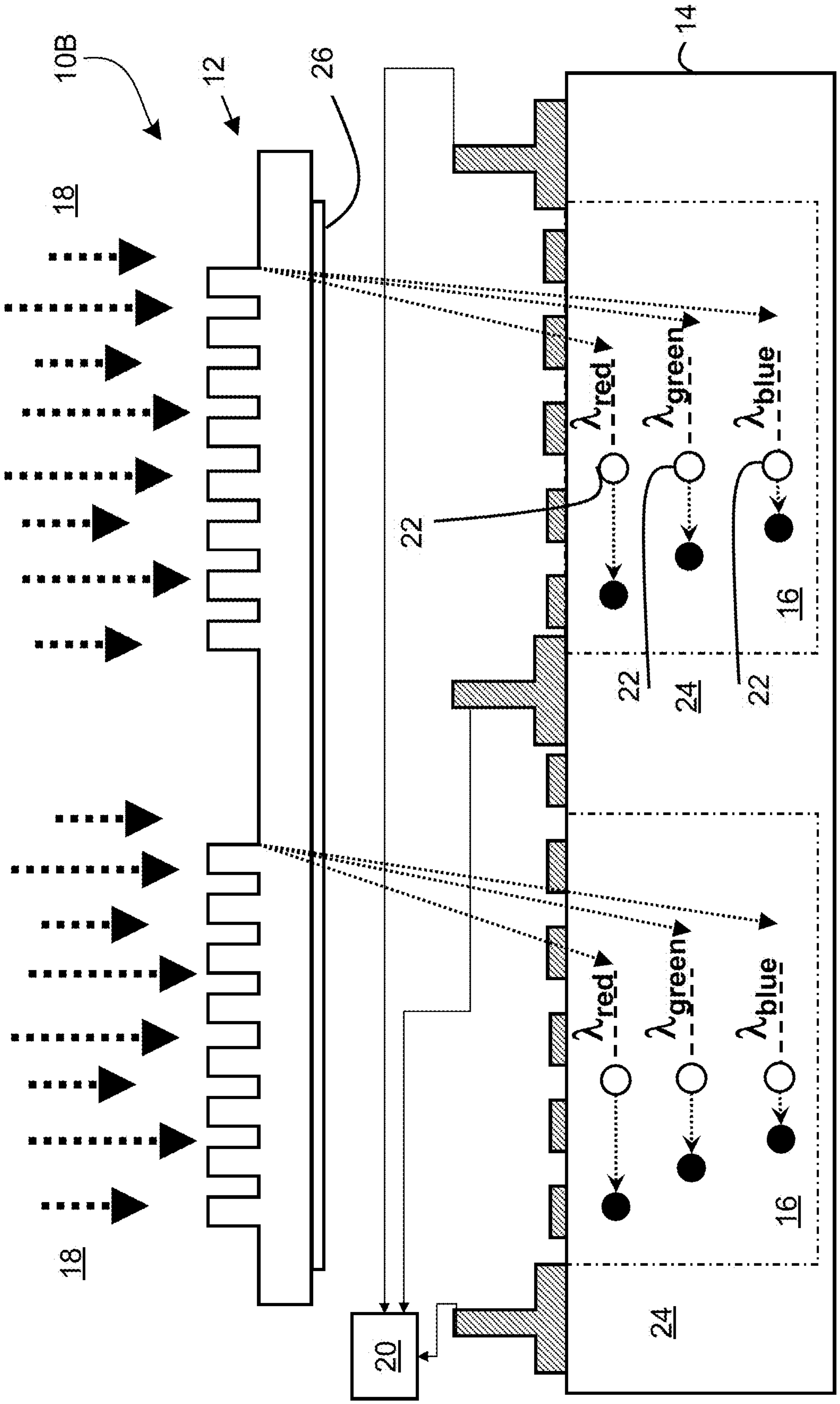
FIG. 4 illustrates a fourth example of an optoelectronic module.

As shown in the example optoelectronic module 10B of FIG. 4, some implementations include a multi-band pass filter 26 operable to pass specific wavelengths or wavelength ranges (e.g., red, green and blue) and to block or substantially attenuate other ranges of wavelengths of electromagnetic radiation (e.g., infra-red and/or ultraviolet). For example, the filter 26 can be attached to, or otherwise integrated with, the underside of the metalens structure 12 such that the filter 26 is disposed between the metalens 12 (or other WSOE structure) and the sensor (i.e., the drift-field demodulation pixels 16).

Figure 3:
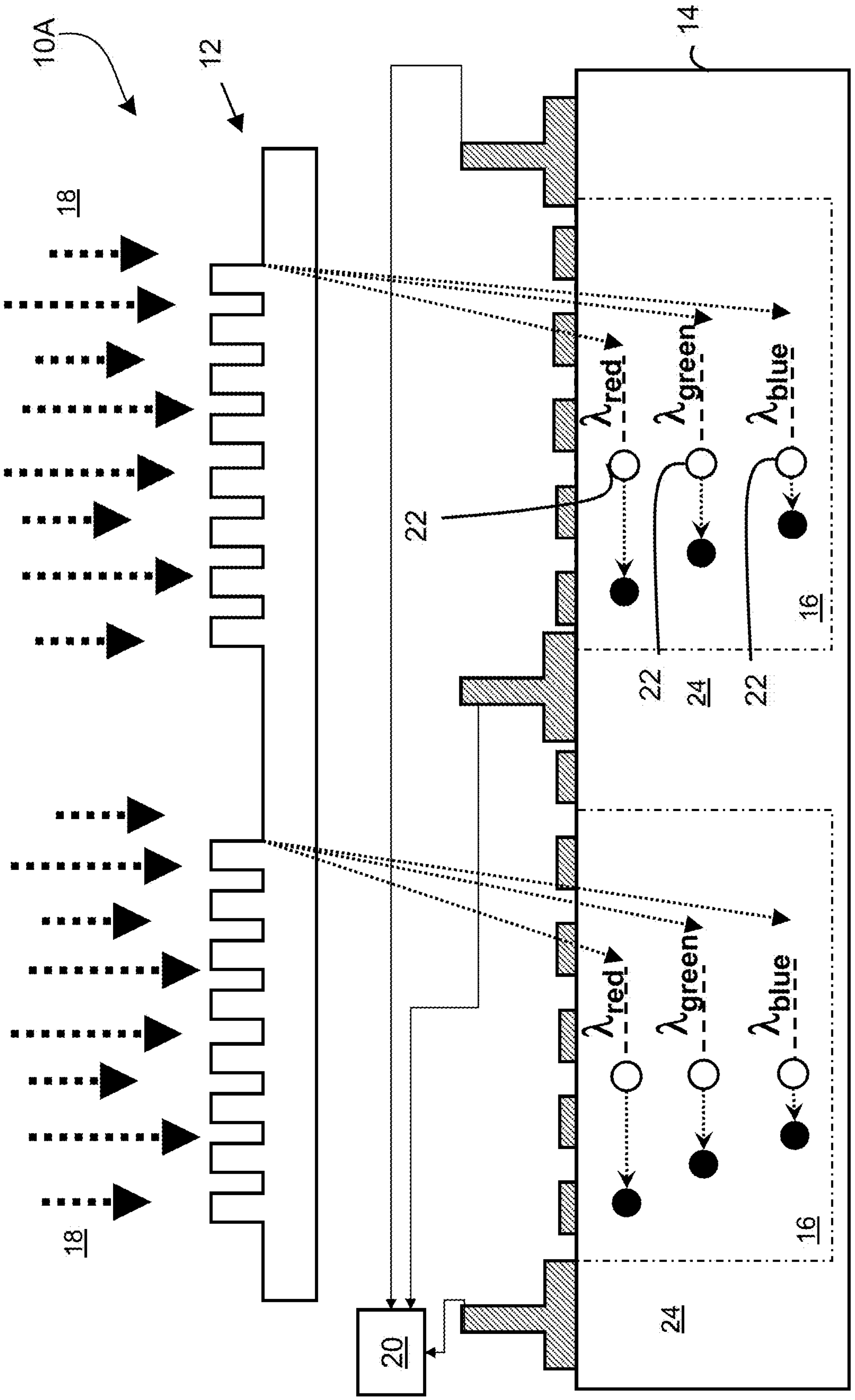
FIG. 3 illustrates a second example of an optoelectronic module.
Figure 5:
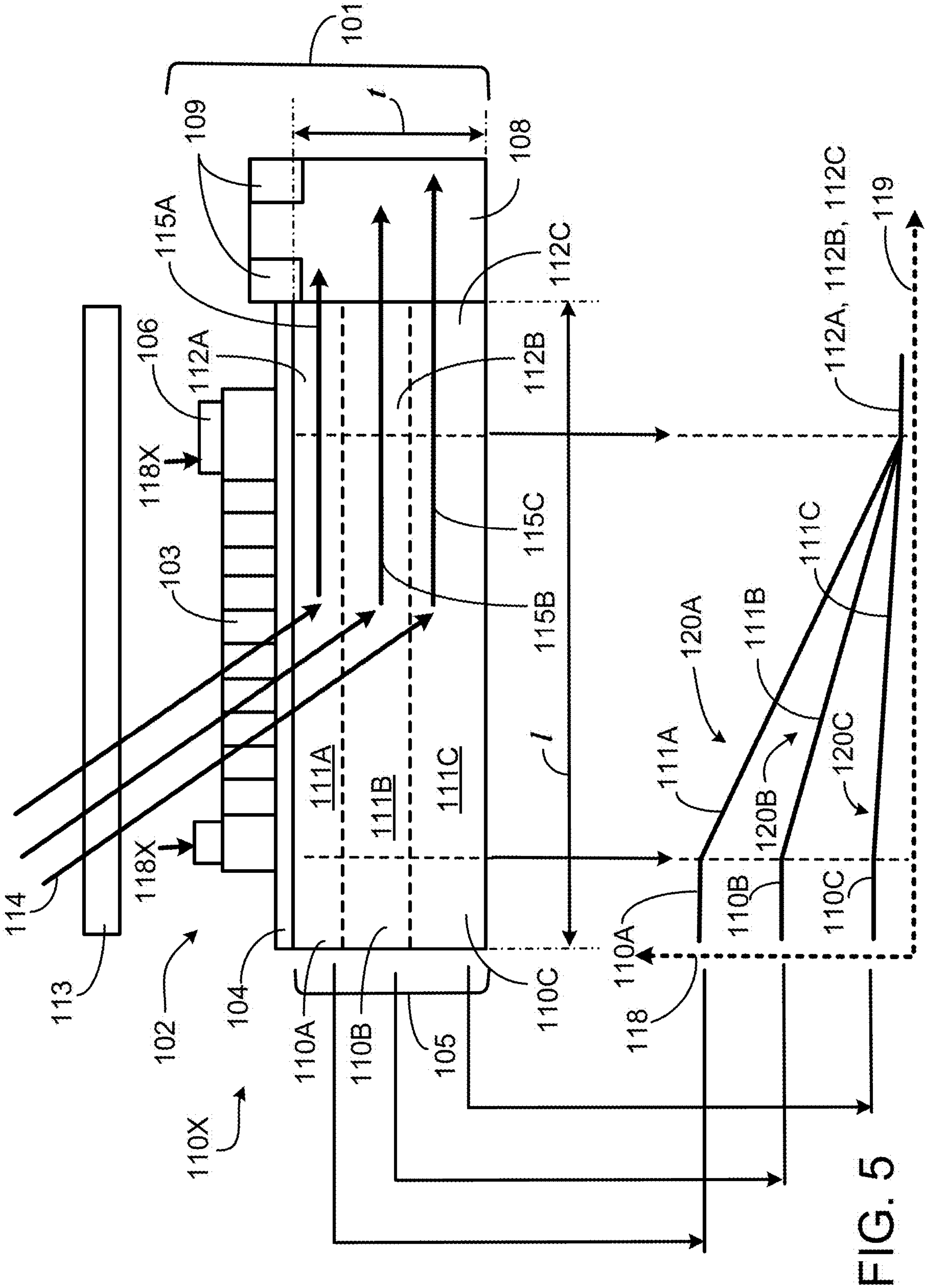
FIG. 5 illustrates an example of a drift-field demodulation pixel.

FIG. 5 illustrates further details of an example drift-field demodulation pixel 101 which can be implemented as the drift-field demodulation pixels 16 in FIGS. 1, 3 and 4. The pixel 101 can facilitate taking advantage of spatially varying charge-carrier drift velocities in the drift-field demodulation pixel so that the module 10 can acquire spectral data. Details of the drift-field demodulation pixels 16 may differ for some implementations. Thus, the drift-field demodulation pixels 16 may be implemented in ways other than the example of FIG. 5.

As shown in FIG. 5, the drift-field demodulation pixel 101 includes a photo-sensitive detection region 102. In the illustrated example, the pixel 101 further includes gates 103, an insulator layer 104, a semiconductor substrate 105, and contact nodes 106. The semiconductor substrate 105 has a thickness t and a lateral dimension 1. In some cases, the lateral dimension 1 can be considerably larger in magnitude than the thickness t. The semiconductor substrate 105 can be composed of silicon, for example, and can be doped with appropriate dopants. However, other semiconductors materials can be used in some implementations to achieve, for example, particular charge-carrier concentrations, spectral sensitivities, and/or charge-carrier mobilities. Still further, the semiconductor substrate 105 can be single crystalline, polycrystalline, and/or a crystalline and/or polycrystalline nanocomposite. Further, in the illustrated example, the gates 103 can be adjacent and electrically isolated from each other.

Potentials (e.g., voltages) 118X can be applied to the contact nodes 106 via electrodes 107. The applied potentials 118X can generate a plurality of potential regions 110X within the semiconductor substrate 105. That is, multiple respective drift-field regions, each of a respective magnitude and spanning a lateral dimension 1 of the semiconductor substrate 105. The drift-field demodulation pixel 101 further includes a charge-collection region 108 (e.g., a charge demodulation region) and output nodes 109. Multi-wavelength electromagnetic radiation 114 can be incident on the drift-field demodulation pixel 101. Although FIG. 5 shows the radiation 114 incident through the front-side of the pixel 101, in some implementations it may incident through the backside of the pixel 101.

In some implementations, a spectral filter 113 may be provided to block or substantially attenuate particular ranges of wavelengths of electromagnetic radiation. For example, in some implementations infrared radiation may be blocked or substantially attenuated, while in other implementations ultraviolet radiation may be blocked or substantially attenuated. The multi-wavelength electromagnetic radiation 114 incident on the drift-field demodulation pixel 101, and consequently, the photo-sensitive detection region 102 can generate photo-generated charges 115 in the semiconductor substrate 105.

In some implementations each potential region 110X can vary with the thickness t and/or the lateral dimension 1 of the semiconductor substrate 105. For example, a potential region can have a constant magnitude at a particular depth in the semiconductor substrate 105 over a particular length of the lateral dimension 1, whereas in other instances, a potential region can have a linearly varying and/or polynomially varying magnitude over a particular length of the lateral dimension 1 and can also vary with the thickness t of the semiconductor substrate. Other variations are possible. Accordingly, multiple potential profiles can be depicted as in FIG. 5 that intersect the respective potential regions.

A discrete number of potential profiles are depicted in FIG. 5 for clarity. However, there may be many more potential profiles (e.g., when the magnitude of a potential region varies continuously with thickness t). Each potential profile depicted in FIG. 5 can be taken as a pathway bisecting the semiconductor substrate 105 at a particular thickness (i.e., at a particular depth from the photo-sensitive detection region 102) and intersecting the respective potential regions. Accordingly, each potential profile depicted can include differing drift-field characteristics over the lateral dimension 1 of the semiconductor substrate 105 over which each potential profile spans. Consequently, respective photo-generated charges (i.e., photo-generated charges that are generated at a particular depth corresponding to a respective potential profile) can be conducted along the lateral dimension 1 of the semiconductor substrate 105 according to a respective potential profile. For example, some potential profiles can permit respective photo-generated charges to travel with a large drift velocity, while other potential profiles can permit respective photo-generated charges to travel with a small drift velocity. The potentials 118X, the arrangement of the contact nodes 106, the gates 103, the insulator layer 104, the semiconductor substrate 105, and/or the doping of any of the foregoing features can be configured to generate multiple potential regions (i.e., regions within the semiconductor substrate 105 with respective drift fields) and, accordingly, can generate potential profiles having any number of characteristic profiles. For example, the respective potential profiles can vary linearly with the lateral dimension 1, or in any other way.

In the illustrated example of FIG. 5, potential profiles 120 includes a first potential profile 120A, a second potential profile 120B, and a third potential profile 120C, wherein each of the first, second, and third potential profiles can span the lateral dimension 1 of the semiconductor substrate 105 laterally. More or fewer discrete potential profiles can be included in other implementations. Moreover, the potential profiles need not include discrete potential profiles, but instead can include a continuous distribution of potential profiles. In some instances, each of the potential regions 110X can include a respective high-potential region (110A, 110B, 110C), a respective drift-field potential region (111A, 111B, 111C), and a respective low-potential region (112A, 112B, 112C). In the illustrated example, the first potential profile 120A can span laterally (or intersect) the first high-potential region 110A, the first drift-field region 111A, and the first low-potential region 112A. Likewise, the second potential profile 120B can span laterally (or intersect) the second high-potential region 110B, the second drift-field region 111B, and the second low-potential region 112B. Further the third potential profile 120C can span laterally (or intersect) the third high-potential region 110C, the third drift-field region 111C, and the third low-potential region 112C.

Generally, the potential regions 110X can facilitate the conduction of the photo-generated charges 115 into the charge-collection region 108 so that a signal can be sampled at the output nodes 109 (e.g., where in some cases the sample can be demodulated at the charge-collection region 108). Further, the potential regions 110X can dump the photo-generated charges 115 when it becomes necessary to drain excess or unwanted charge from the drift-field demodulation pixel 101.

In some implementations the potential profiles 120A, 120B and 120C vary with thickness t of the semiconductor substrate 105, and different wavelengths within the multi-wavelength electromagnetic radiation 114 incident on the photo-sensitive detection region 102 can penetrate the semiconductor substrate 105 to different depths. In such cases, the photo-generated charges 115 generated at different depths can be associated with different portions of the multi-wavelength electromagnetic radiation 114. Accordingly, as the potential profiles 120 are distributed over a range of depths in this implementation, the photo-generated charges 115 generated at different depths can have different respective drift velocities. For example, in the illustrated example, different portions of the multi-wavelength electromagnetic radiation 114 can penetrate the semiconductor substrate 105 to different depths. That is, ranges of wavelengths of the multi-wavelength electromagnetic radiation 114 primarily corresponding to red light can penetrate to the third drift-field region 111C, ranges of wavelengths of the multi-wavelength electromagnetic radiation 114 primarily corresponding to green light can penetrate to the second drift-field region 111B, and ranges of wavelengths of the multi-wavelength electromagnetic radiation 114 primarily corresponding to blue light can penetrate to the first drift-field region 111A. Accordingly, first photo-generated charges 115A, second photo-generated charges 115B, and third photo-generated charge 115C can correspond primarily to respective portions of the multi-wavelength electromagnetic radiation 114 (e.g., respectively blue, green, and red in this example).

Still further, as each of the photo-generated charges 115A, 115B, 115C is subjected to respective potential profiles 120A, 120B, 120C, each has a respective drift velocity 116A, 116B, 116C dictated in part by the respective potential profiles 120A, 120B, 120C. Since the photo-generated charges 115A, 115B, 115C have respective drift velocities, and in this implementation each respective drift velocity is different, the photo-generated charges 115A, 115B, 115C will arrive at the charge-collection region 108 at different points in time. Accordingly, signals associated with the respective photo-generated charges 115A, 115B, 115C can be sampled (e.g., read out) at different times and can be associated with the different portions of the multi-wavelength electromagnetic radiation 114 incident on the photo-sensitive detection region 102. Consequently, spectral data such as the composition of the multi-wavelength electromagnetic radiation 114 can be determined (e.g., the wavelengths and/or wavelength ranges and their respective intensities can be determined).

The lower part of FIG. 5 depicts a potential or drift-field magnitude 118 on the y-axis and a lateral dimension or coordinate 119 on the x-axis of a plot depicting the first potential profile 120A, second potential profile 120B, and third potential profile 120C. As depicted, the first potential profile 120A varies from a high potential to a low potential (from left to right). The second potential profile 120B and the third potential profile 120C vary in a similar way. Moreover, the potential regions 110X also are depicted.

Figure 6:
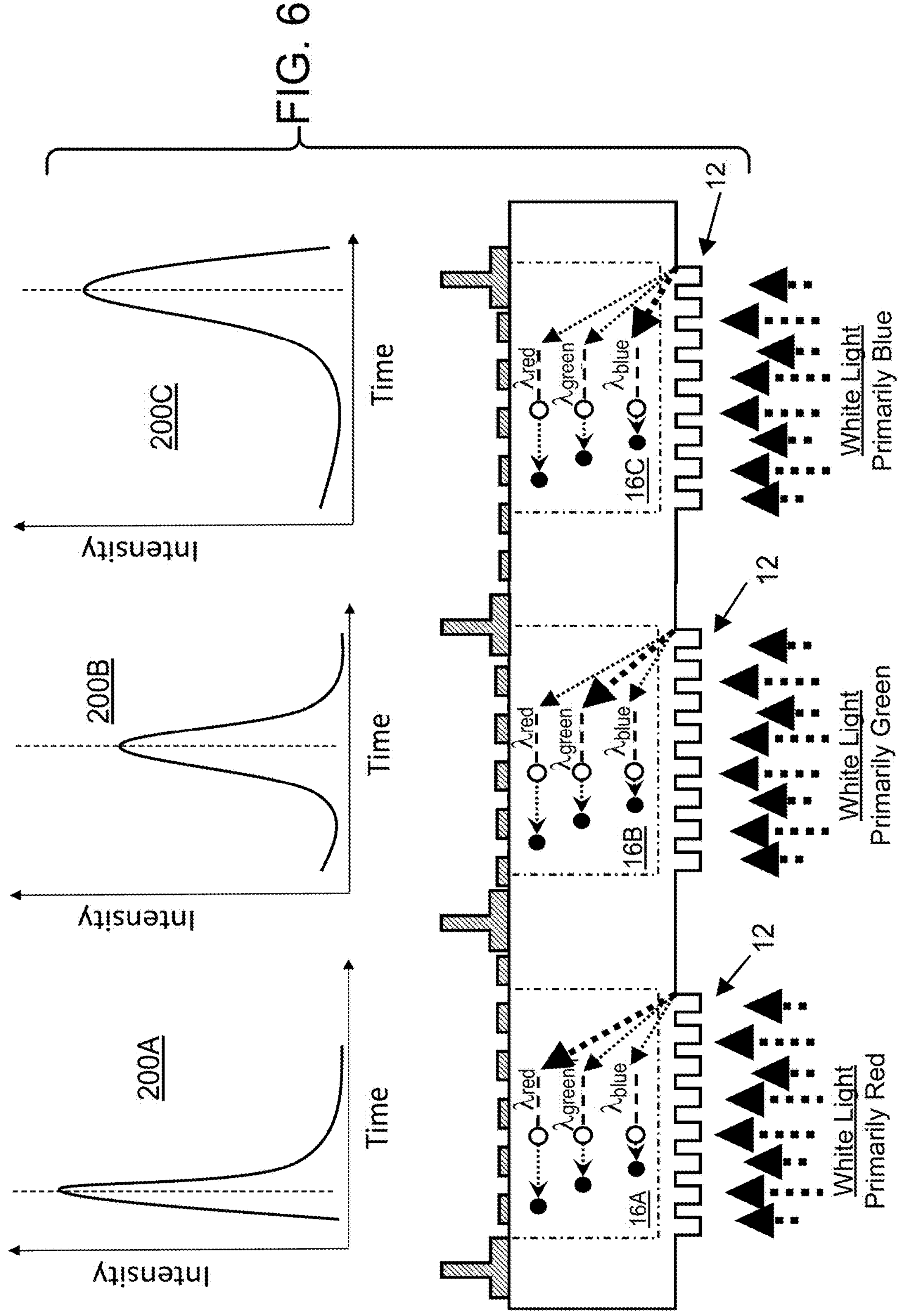
FIG. 6 illustrates demodulation pixels and associated graphs showing detected intensity versus time.

FIG. 6 illustrates three demodulation pixels 16A, 16B, 16C and associated graphs 200A, 200B, 200C showing detected intensity versus time. In this example, the pixels 16A, 16B, 16C are substantially the same as one another. In each demodulation pixel 16A, 16B, 16C, various potential profiles are distributed over a range of depths, and photo-generated charges generated at different depths are associated with different portions of the electromagnetic spectrum (e.g., red, green, blue light). The potential profiles result in the photo-generated charges generated at different depths having different respective drift velocities. As the photo-generated charges generated at different depths have different respective drift velocities, the photo-generated charges will arrive at the pixel's charge-collection region at different points in time (e.g., photo-generated charges corresponding to red light will arrive first, then green, and then blue).

As further shown in FIG. 6, a respective metalens 12 is disposed on each demodulation pixel 16A, 16B, 16C such that incident light (e.g., white light) passes through one of the metalenses before reaching the associated pixel. Each metalens 12 focuses respective wavelengths onto different respective regions in the associated pixel 16. For example, red light ($\lambda_{red}$) can be focused to a first depth within each pixel, green light ($\lambda_{green}$) can be focused to a second depth within each pixel, and blue light ($\lambda_{blue}$) can be focused to a third depth within each pixel. In the illustrated example, the light incident on the first pixel 16A is composed primarily of red light, the light incident on the second pixel 16B is composed primarily of green light, and the light incident on the third pixel 16C is composed primarily of blue light.

As indicated by the graphs 200A, 200B, 200C, most of the photo-generated charges in the first pixel 16A will arrive at the pixel's charge-collection region at a first time, most of the photo-generated charges in the second pixel 16B will arrive at the pixel's charge-collection region at a subsequent second time, and most of the photo-generated charges in the third pixel 16C will arrive at the pixel's charge-collection region at an even later third time. Based on the different detection times, processing circuitry can determine that the light incident on the first pixel 16A is primarily red light, light incident on the second pixel 16B is primarily green light, and light incident on the third pixel 16C is primarily blue light.

Figure 7:
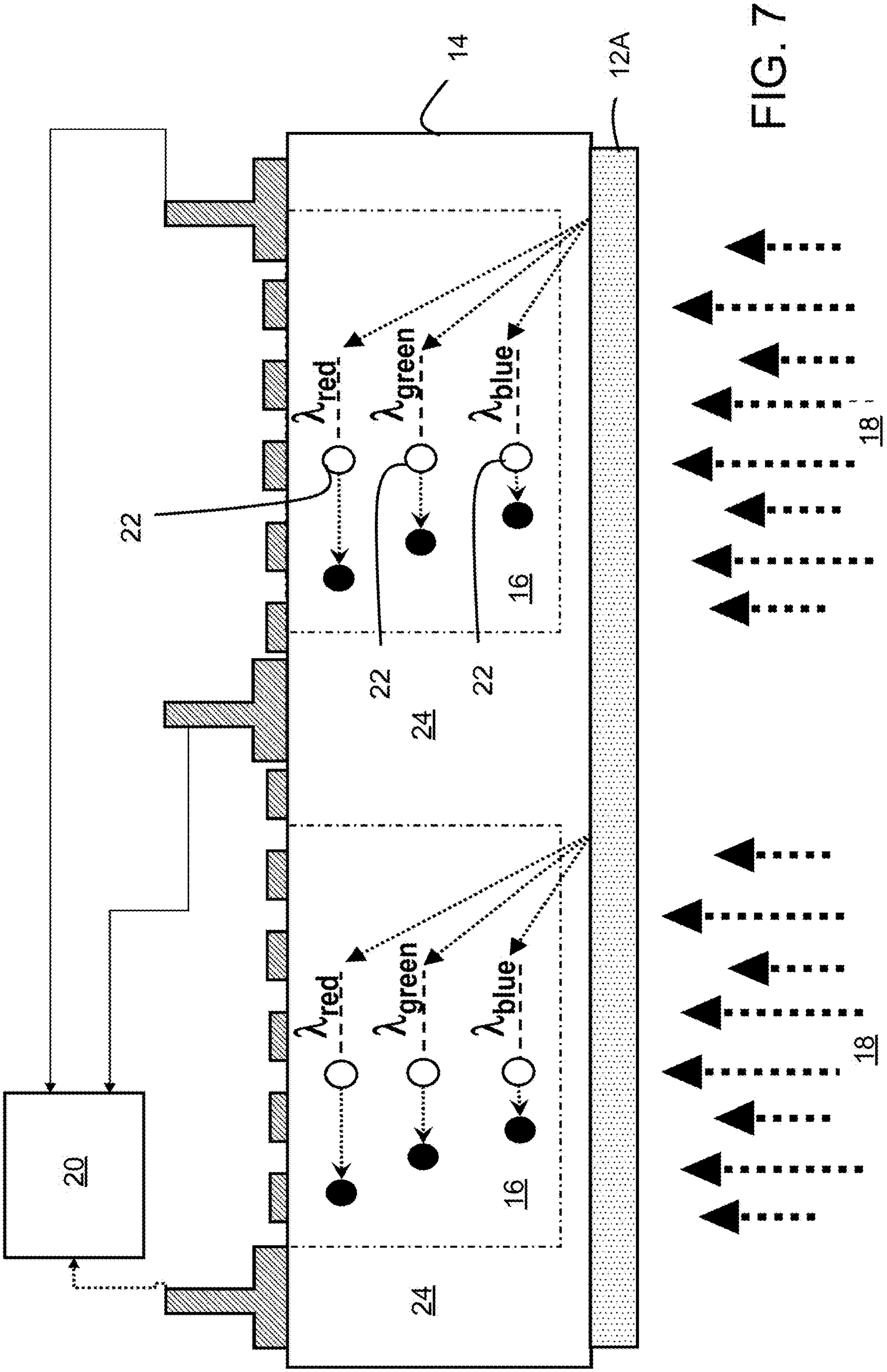
FIG. 7 illustrates an example of an optoelectronic module that includes a high dispersion layer as the WSOE.

As mentioned above, in some cases, the WSOE can be implemented as a high dispersion layer or a high dispersion lens. FIG. 7 illustrates an example in which a high dispersion layer 12A is integrated or otherwise attached to the backside of a substrate 14 in which is formed an array of drift-field demodulation pixels 16. The high dispersion layer 12A is configured such that when light 18 having multiple wavelengths is incident on the high dispersion layer 12A, different wavelengths are focused on different spatial points in the respective pixels 16 in a manner similar to that described for the metalens in FIG. 1.

Figure 8:
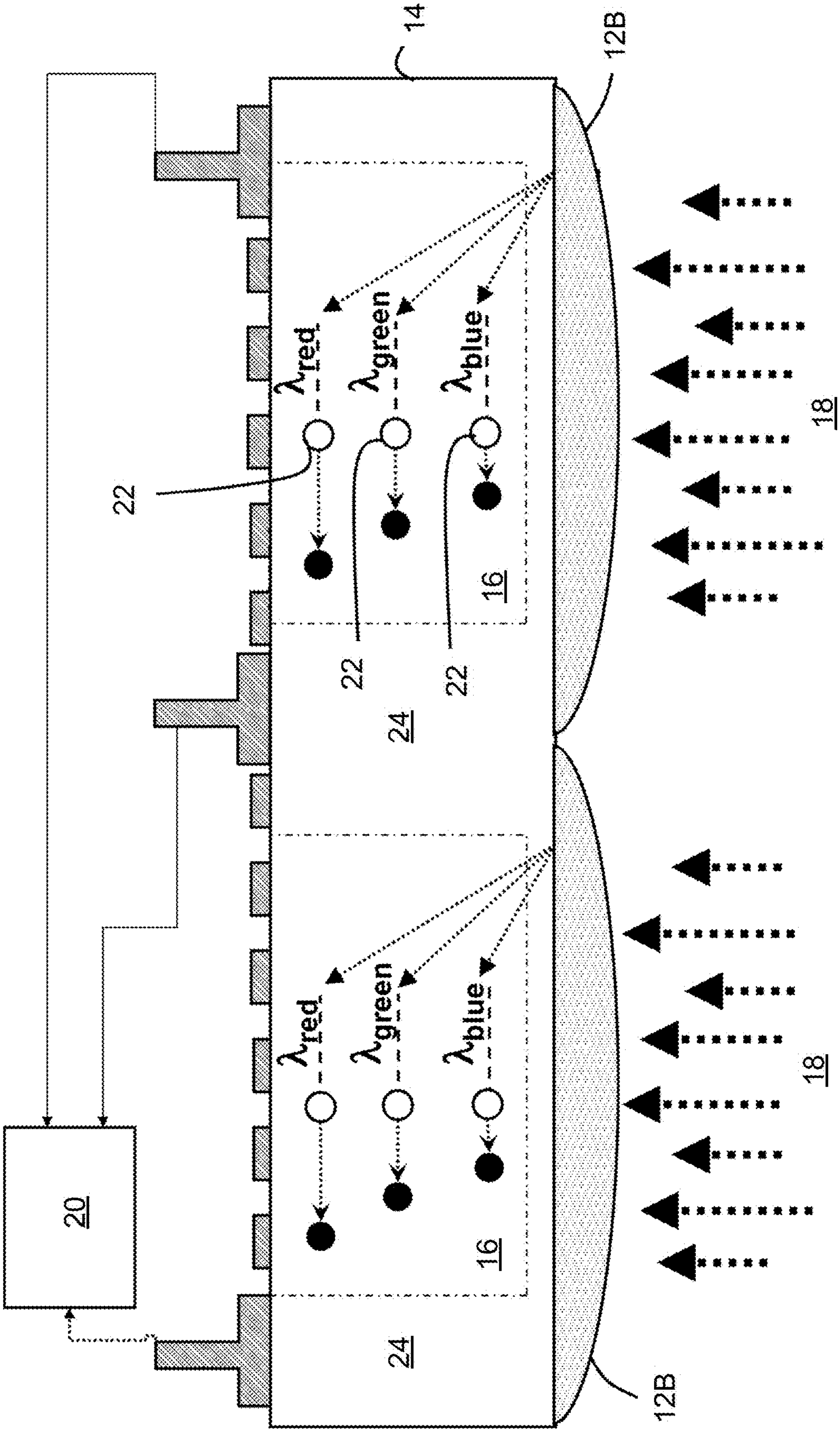
FIG. 8 illustrates an example of an optoelectronic module that includes a high dispersion lens as the WSOE.

Similarly, FIG. 8 illustrates an example in which high dispersion lenses 12B are integrated or otherwise attached to the backside of a substrate 14 in which is formed an array of drift-field demodulation pixels 16. Each high dispersion lens 12B is configured such that when light 18 having multiple wavelengths is incident on the high dispersion lens 12B, different wavelengths are focused on different spatial points in the respective pixel 16 in a manner similar to that described for the metalens in FIG. 1.

Figure 9:
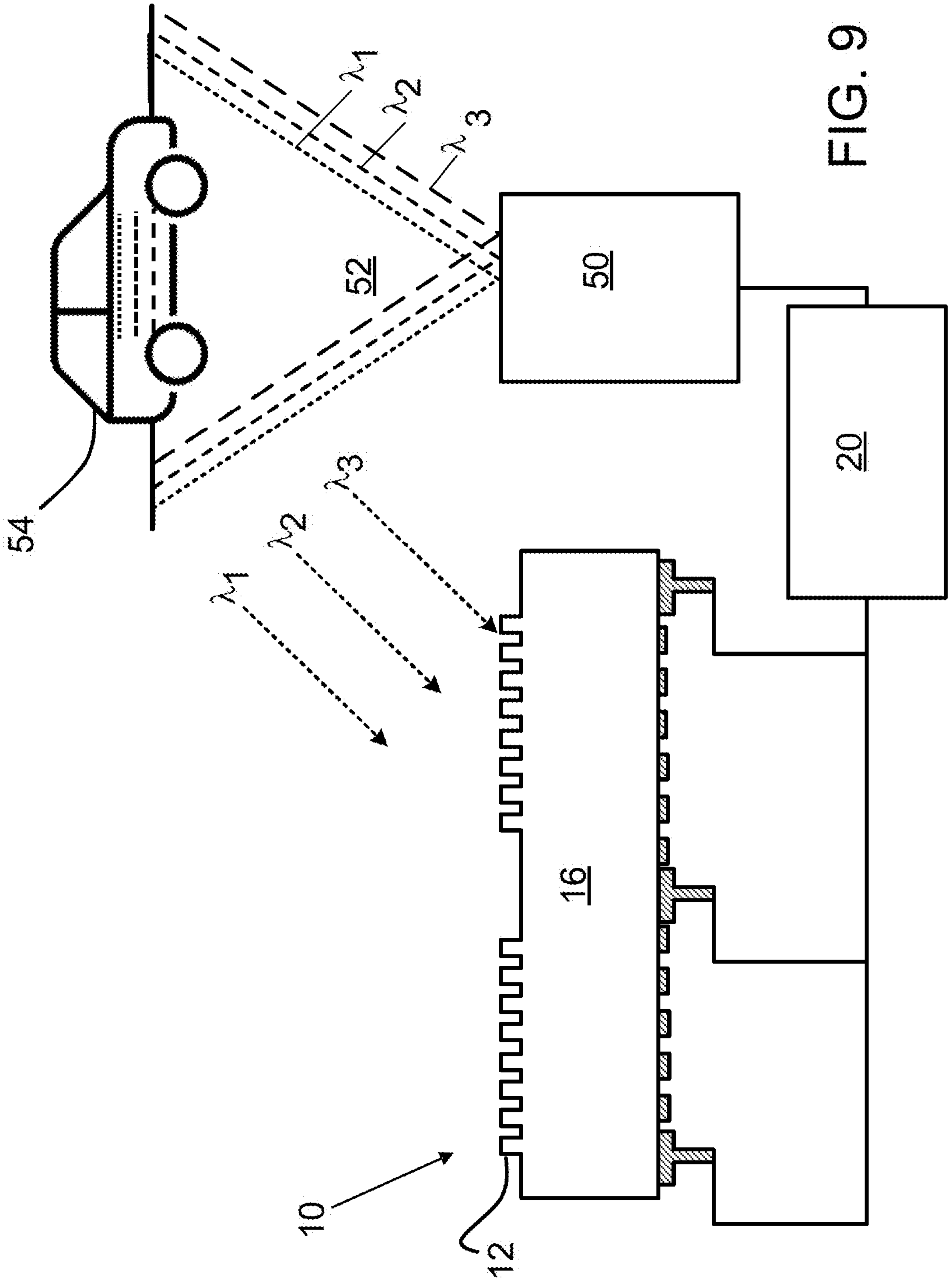
FIG. 9 illustrates an example of enhanced structured light imaging.

FIG. 9 illustrates an example of a particular application using the optoelectronic module 10 of FIG. 1 or any of the other optoelectronic modules described in this disclosure. The illustrated example of FIG. 9 provides enhanced structured light imaging. For example, three different structured light patterns can be configured for three different distance ranges. In the illustrated example, each of the patterns is implemented using a different respective wavelength (i.e., $\lambda_1$, $\lambda_2$, or $\lambda_3$), which allows each of the three patterns to be distinguished by the pixel array based on the respective wavelength. The circuitry 20 can be configured, in this case, also to control emission of radiation 52 from a radiation source 50 toward an object 54. In the illustrated example, the radiation source is operable to emit light at the respective wavelengths (i.e., in this case, $\lambda_1$, $\lambda_2$, and $\lambda_3$).

Enhanced structured light imaging can be used, for example, in enhanced three dimensional (3D) mapping using time-of-flight (TOF) techniques. It also can be used to enable multispectral light detection and ranging (LiDAR), for example, to merge spectral and LiDAR data for enhanced object identification or scene mappings.

Various aspects of the subject matter and the functional operations described in this specification (e.g., the circuitry 20) can be implemented in digital electronic circuitry, or in computer software, firmware, or hardware, or in combinations of one or more of them. Thus, aspects of the subject matter described in this specification can be implemented as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The apparatus can include, in addition to hardware, code that creates an execution environment for the computer program in question, e.g., code that constitutes processor firmware.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

Various modifications can be made to the foregoing examples. Thus, other implementations also are within the scope of the claims.

What is claimed is:

1. An apparatus comprising:

a sensor including a drift-field demodulation pixel;

a wavelength separating optical element (WSOE) disposed such that, when radiation is incident on the drift-field demodulation pixel, the radiation passes through the WSOE before reaching the drift-field demodulation pixel, and wherein the WSOE is configured to focus different wavelengths of the incident radiation at different respective depths in a photo-sensitive detection region of the drift-field demodulation pixel.

2. The apparatus of claim 1 wherein the drift-field demodulation pixel has different potential profiles distributed over the different respective depths.

3. The apparatus of claim 2 wherein the drift-field demodulation pixel is operable such that photo-generated charges generated at the different respective depths have different respective drift velocities.

4. The apparatus of claim 3 further including read-out circuitry coupled to an output of the drift-field demodulation pixel and operable to sample the photo-generated charges at different times based on the different respective drift velocities.

5. The apparatus of claim 2 wherein the WSOE comprises a metastructure including meta-atoms.

6. The apparatus of claim 3 wherein the WSOE comprises a metastructure including meta-atoms.

7. The apparatus of claim 4 wherein the WSOE comprises a metastructure including meta-atoms.

8. The apparatus of claim 1 wherein the WSOE is attached to the drift-field demodulation pixel.

9. The apparatus of claim 8 wherein the WSOE is attached to a backside of the drift-field demodulation pixel.

10. The apparatus of claim 9 wherein the WSOE comprises a metastructure including meta-atoms.

11. The apparatus of claim 8 wherein the WSOE is disposed over a front-side of the drift-field demodulation pixel.

12. The apparatus of claim 11 wherein the WSOE is separated at a distance from the front-side of the drift-field demodulation pixel.

13. The apparatus of claim 11 further including a multi-band pass filter disposed between the WSOE and the drift-field demodulation pixel.

14. The apparatus of claim 11 wherein the WSOE comprises a metastructure including meta-atoms.

15. The apparatus of claim 8 wherein the WSOE comprises a metastructure including meta-atoms.

16. The apparatus of claim 1 wherein the WSOE comprises a metastructure including meta-atoms arranged so that the metastructure is operable as a lens.

17. A method comprising:

receiving radiation in a photo-sensitive detection region of a drift-field demodulation pixel, wherein the radiation passes through a wavelength separating optical element (WSOE) before reaching the drift-field demodulation pixel, and wherein the WSOE focuses different wavelengths of the radiation at different respective depths in the drift-field demodulation pixel.

18. The method of claim 17, wherein the drift-field demodulation pixel generates photo-generated charges in response to receiving the different wavelengths of the radiation at different respective depths, the method further including:

sampling, at different time, signals associated with the photo-generated charges at the different depths.

19. The method of claim 18 further including:

determining spectral data based on the sampled signals.

20. The method of claim 19 further including:

combining images based on the sampled signals to obtain a multi-color image for the drift-field demodulation pixel.

* * * * *